(12) United States Patent
Kitani et al.

(10) Patent No.: US 6,555,887 B1
(45) Date of Patent: Apr. 29, 2003

(54) SEMICONDUCTOR DEVICE WITH MULTI-LAYER INTERCONNECTION

(75) Inventors: Takeshi Kitani, Hyogo (JP); Takeru Matsuoka, Hyogo (JP); Masayoshi Shirahata, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/368,345

(22) Filed: Aug. 5, 1999

(30) Foreign Application Priority Data

Aug. 11, 1998 (JP) ............................ 10-226935
May 14, 1999 (JP) ............................ 11-134121

(51) Int. Cl.[7] ........................................ H01L 31/119
(52) U.S. Cl. ..................... 257/413; 257/754; 257/755
(58) Field of Search ...................... 257/413, 412, 257/250, 217, 249, 754, 755, 757, 758; 438/659, 581, 583, 630, 649, 651, 655

(56) References Cited

U.S. PATENT DOCUMENTS

| 4,450,620 A | * | 5/1984 | Fuls et al. ..................... 29/571 |
| 4,782,033 A | * | 11/1988 | Gierisch et al. ............... 437/56 |
| 4,974,046 A | * | 11/1990 | Vora ............................. 357/34 |
| 5,013,686 A | | 5/1991 | Choi et al. ................... 437/194 |
| 5,744,398 A | * | 4/1998 | Byun et al. .................. 438/592 |
| 5,783,850 A | * | 7/1998 | Liau et al. ................... 257/355 |
| 5,837,605 A | * | 11/1998 | Park et al. ................... 438/649 |
| 5,917,223 A | * | 6/1999 | Ohuchi et al. ............... 257/384 |
| 6,124,202 A | * | 9/2000 | Jeon et al. ................... 438/649 |
| 6,255,214 B1 | * | 7/2001 | Wieczorek et al. ......... 438/659 |
| 6,281,118 B1 | * | 8/2001 | Park ............................. 438/655 |

FOREIGN PATENT DOCUMENTS

| JP | 3-6821 | 1/1991 |
| JP | 5-315333 | 11/1993 |

* cited by examiner

Primary Examiner—Tom Thomas
Assistant Examiner—Douglas W. Owens
(74) Attorney, Agent, or Firm—McDermott, Will & Emery

(57) ABSTRACT

A semiconductor device with a polycide interconnection including a refractory metal silicide film improved in adherence with an interlayer insulation film, and a method of fabricating such a semiconductor device are provided. The local impurity concentration of a tungsten silicide film in the proximity of the interface between an interlayer oxide film and the tungsten silicide film is set to $5 \times 10^{19}$ atms/cm$^3$–$2 \times 10^{22}$ atms/cm$^3$.

14 Claims, 8 Drawing Sheets

SEMICONDUCTOR DEVICE WITH MULTI-LAYER INTERCONNECTION

BACKGROUND OF THE INVENTION

1. Field of the Invention

The present invention relates to a semiconductor device and a fabrication method thereof. More particularly, the present invention relates to a semiconductor device having a multilayer interconnection structure including a polycrystalline silicon film and a refractory metal silicide film, and a method of fabricating such a semiconductor device.

2. Description of the Background Art

Conventional gate electrode interconnections and also contact interconnections for connection with a gate electrode or for contact with a substrate are formed of a single layer interconnection constituted by a polycrystalline silicon film doped with impurities such as phosphorous (P), arsenic (As) and boron (B). This is because a polycrystalline silicon film having a high melting point is impervious to the thermal treatment of high temperature carried out after formation of the gate electrode. Also, a refractory metal silicide film of low resistance and high melting point is a possible consideration to meet the requirement of a material of low resistance in accordance with increase of the integration density in the recent semiconductor devices. However, the usage of a unitary refractory metal silicide film is disadvantageous in that the workability is inferior under the existing circumstances. At the present stage, a refractory metal silicide film and a polycrystalline silicon film are layered to form a double layered structure of a polycrystalline silicon film/refractory metal silicide film, used as the gate electrode interconnection or the contact interconnection. The requirement of low resistance and high melting point is satisfied in this way.

The interconnection of a double layered interconnection structure of a polycrystalline silicon film/refractory metal silicide film conventionally used will be described hereinafter with reference to FIGS. 15–17.

First, a method of fabricating a conventional semiconductor device will be described. Referring to FIG. 15, an isolation oxide film 102 is formed on an n type silicon substrate 101 by the LOCOS (Local Oxidation of Silicon) method. Next, a silicon oxide film 103 of 100 Å in film thickness functioning as a gate insulation film is formed at an element formation region by thermal oxidation. Then, a polycrystalline silicon film 104 of 700 Å in thickness is formed on silicon oxide film 103 using a tubular type reduced pressure CVD (Chemical Vapor Deposition) apparatus under the condition of 575° C. for the film growth temperature and 0.2 Torr for the deposition pressure with $PH_3$ as the dopant, so that the concentration of impurity added P becomes $6 \times 10^{20}$ atms/cm$^3$. Then, a tungsten silicide film 105 of 700 Å in thickness is formed on polycrystalline silicon film 104 using a single wafer CVD apparatus under the condition of 550° C. for the film growth temperature and 1.2 Torr for the deposition pressure, resulting in the state shown in FIG. 16. A gate electrode 145 of a MOS transistor is formed using lithography and dry etching. Then, gate electrode 145 is covered with an interlayer oxide film 106, resulting in the state shown in FIG. 17.

When an interconnection of a double layered structure of polycrystalline silicon film 104/tungsten silicide film 105 formed as described-above is used, the P impurities doped into polycrystalline silicon film 104 will diffuse into tungsten silicide film 105 during the thermal treatment. This means that a depletion layer will be formed in proximity to the junction plane of polycrystalline silicon film 104/tungsten silicide film 105 when an interconnection of the double layered structure of polycrystalline silicon film 104/tungsten silicide film 105 is used for the gate electrode. This depletion layer will function as the resistance to the current flowing from the interconnection to the gate electrode when an electric field is applied to the gate electrode. The property of the transistor will be adversely affected.

A depletion layer will be formed in proximity to the junction plane of the polycrystalline silicon film/refractory metal silicide film to affect the contact resistance when the interconnection of the double layered structure of the polycrystalline silicon film/refractory metal silicide film is used for the contact of a silicon substrate and another electrode interconnection and for the contact of the interconnection of the polycrystalline silicon film/refractory metal silicide film of a double layered structure.

Japanese Patent Laying-Open Nos. 5-315333, 3-6821, and 8-264786 disclose the technique to solve the above problem. These techniques include the improvement of subjecting the refractory metal silicide film to ion implantation such as P which is the impurity of the conductivity type identical to that of the polycrystalline silicon film, or depositing a refractory metal silicide film doped with P in advance. By suppressing diffusion of the impurity from the polycrystalline silicon film to the refractory metal silicide film, formation of a depletion layer in proximity to the junction between the polycrystalline silicon film and the refractory metal silicide film can be reduced. As a result, degradation in the transistor property of the gate electrode is suppressed.

The technique disclosed in the aforementioned publications of suppressing formation of a depletion layer located around the contact plane with the polycrystalline silicon film by introducing impurities into the refractory metal silicide had the following problem. Considering gate electrode 145 shown in FIG. 17 as an example, the effect of impurity implantation is low, i.e., the effect of suppressing formation of a depletion layer in proximity to the interface between polycrystalline silicon film 104 and refractory metal silicide film 105 is low if the impurity concentration is lower than a predetermined value. As a result, the transistor property is degraded. When the impurity concentration is higher than a predetermined value, peel off occurs at the interface between interlayer oxide film 106 and refractory metal silicide film 105.

SUMMARY OF THE INVENTION

In view of the foregoing, an object of the present invention is to provide a semiconductor device of a multilayer interconnection structure capable of preventing generation of peel off at the interface between a refractory metal silicide film and an interlayer oxide film while maintaining the effect of preventing formation of a depletion layer at the junction plane for a polycide interconnection, and a method of fabricating such a semiconductor device.

According to an aspect of the present invention, a semiconductor device includes a silicon-containing film formed on a semiconductor substrate, and having a first impurity, a refractory metal silicide film formed on the silicon-containing film, and having a second impurity of a conductivity type identical to that of the first impurity, and an insulation film formed on the refractory metal silicide film. The concentration of the second impurity in proximity to the interface between the insulation film and the refractory metal silicide film is set to the range of $5\times10^{19}$ atms/cm³–$2\times10^{22}$ atms/cm³.

In the semiconductor device of the present invention, the silicon-containing film preferably includes a polycrystalline silicon film.

In the semiconductor device of the present invention, the second impurity preferably includes one or more materials selected from the group consisting of P, As, B and $BF_2$.

In the semiconductor device of the present invention, the refractory metal silicide film further preferably includes a tungsten silicide film, a cobalt silicide film or a titanium silicide film.

In the semiconductor device of the present invention, the insulation film preferably includes a silicon oxide film.

In the semiconductor device of the present invention, the silicon-containing film and the refractory metal silicide film can form the gate electrode of an electric field transistor.

In the semiconductor device of the present invention, the silicon-containing film can be directly connected to the surface of the semiconductor substrate.

The semiconductor device of the present invention can have the silicon-containing film directly connected to another conductive layer.

The reason why the concentration of the second impurity in the refractory metal silicide film around the interface at the insulation film side is limited to be not more than $2\times10^{22}$ atms/cm³ is that peel off occurs at the interface between the insulation film and the refractory metal silicide film when the concentration of the second impurity becomes greater than $2\times10^{22}$ atms/cm³. Also, the concentration of the second impurity included in the refractory metal silicide film around the interface at the insulation film side is set to be at least $5\times10^{19}$ atms/cm³. If that concentration of the second impurity is lower than $5\times10^{19}$ atms/cm³, the impurity concentration of the entire refractory metal silicide film is reduced to degrade the feature of suppressing diffusion of the first impurity from the silicon-containing film to the refractory metal silicide film. The silicon-containing film will cause formation of a depletion layer in the neighborhood of the interface with the refractory metal silicide film. By limiting the concentration of the second impurity in proximity to the interface with the insulation film to be $5\times10^{19}$ atms/cm³–$2\times10^{22}$ atms/cm³, formation of a depletion layer between the silicon-containing film and the refractory metal silicide film can be suppressed. Also, the peel off at the interface between the insulation film and the refractory metal silicide film can be prevented.

According to another aspect of the present invention, a method of fabricating a semiconductor device includes the steps of forming a silicon-containing film having a first impurity on a semiconductor substrate, forming on the silicon-containing film a refractory metal silicide film having a second impurity of a conductivity type identical to that of the first impurity, forming an insulation film on the refractory metal silicide film, and applying thermal treatment on the silicon-containing film and the refractory metal silicide film to set the concentration of the second impurity in proximity to the interface between the insulation film and the refractory metal silicide film to be $5\times10^{19}$ atms/cm³–$2\times10^{22}$ atms/cm³.

By the step of applying thermal treatment so as to restrict the impurity concentration of the second impurity in the neighborhood of the interface with the insulation film to be $5\times10^{19}$ atms/cm³–$2\times10^{22}$ atms/cm³, a semiconductor device can be provided that has formation of a depletion layer between the silicon-containing film and the refractory metal silicide film suppressed, and peel off between the insulation film and the refractory metal silicide film prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
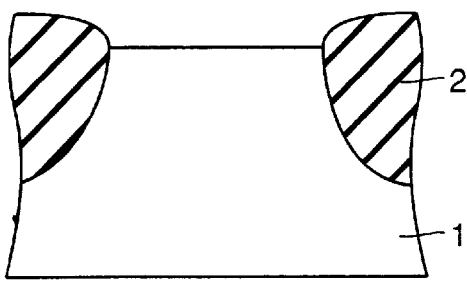
FIGS. 1, 2 and 3 are sectional views of a semiconductor device according to a first embodiment of the present invention corresponding to respective steps in a fabrication method thereof.
Figure 2:
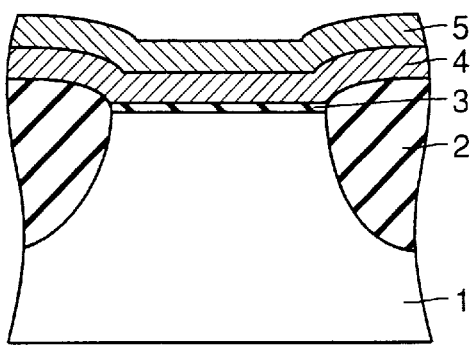
Figure 3:
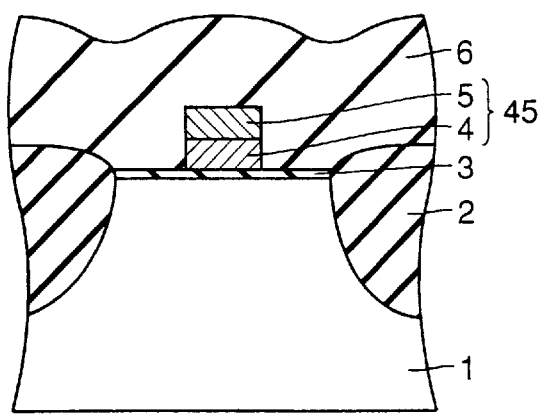

The method of fabricating a semiconductor device according to a first embodiment of the present invention will be described with reference to FIGS. 1–4. As shown in FIG. 1, an isolation oxide film 2 is formed on an n type silicon substrate 1 by the LOCOS method. A silicon oxide film 3 of 100 Å in film thickness functioning as a gate insulation film is formed at an element formation region by thermal oxidation. Using a tubular type reduced pressure CVD apparatus, a polycrystalline silicon film 4 doped with P in advance is formed on silicon oxide film 3 to the thickness of 700 Å under the condition of 575° C. for the film growth temperature and 0.2 Torr for the deposition pressure with $PH_3$ as the dopant, so that the average impurity concentration becomes $6\times10^{20}$ atms/cm$^3$. Then, using a single wafer reduced pressure CVD apparatus, a tungsten silicide film 5 of 700 Å in film thickness is formed on polycrystalline silicon film 4 under the condition of 550° C. for the film growth temperature and 1.2 Torr for the deposition pressure, as shown in FIG. 2. Then, P is implanted into tungsten silicide film 5 under the condition of 20 keV for the implantation acceleration rate and $4\times10^{15}$ cm$^2$ for the implantation amount. By means of lithography and dry etching, a gate electrode 45 of a MOS transistor is formed. Then, an interlayer oxide film 6 is formed so as to cover gate electrode 45, as shown in FIG. 3. Polycrystalline silicon film 4 and tungsten silicide film 5 are subjected to thermal treatment to set the local impurity concentration of tungsten silicide film 5 in the neighborhood of the interface between interlayer oxide film 6 and tungsten silicide film 5 to be $5\times10^{19}$ atms/cm$^3$–$2\times10^{22}$ atms/cm$^3$.

According to a semiconductor device formed by the above-described fabrication method, the gate electrode has a double layered structure of polycrystalline silicon film 4/tungsten silicide film 5. The average impurity concentration of polycrystalline silicon film 4 is $6\times10^{20}$ atms/cm$^3$. The average impurity concentration of tungsten silicide film 5 is approximately $2\times10^{20}$ atms/cm$^3$.

Figure 4:
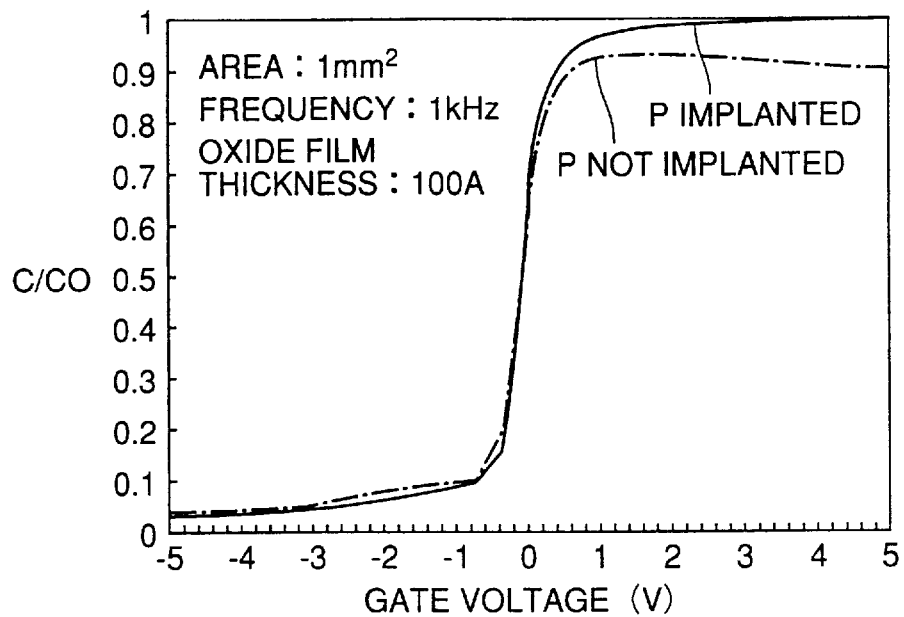
FIG. 4 is a graph to compare the measured electrostatic capacity across a gate electrode implanted with P and a gate electrode not implanted with P, when a predetermined voltage is applied across a gate electrode formed of a double layered structure interconnection of the semiconductor device of the first embodiment.

The capacity and the voltage using high frequency are evaluated at the gate voltage of –5V–5V for a MOS transistor formed including the above-described steps with the frequency set at 1 kHz. FIG. 4 is a graph representing the relationship between C/CO and the gate voltage where CO is the capacity of the gate electrode when no depletion layer is formed and C is the electrostatic capacity measured across the gate electrode when a depletion layer is formed. The ratio of various values of the capacity is plotted along the ordinate and the gate voltage is plotted along the abscissa. It is appreciated from FIG. 4 that the gate electrode that does not have P implanted into tungsten silicide film 5 exhibits a smaller electrostatic capacity measured via the gate electrode and the gate insulation film when positive bias is applied than the gate electrode having P implanted into the tungsten silicide film. If P is not implanted, a depletion layer will be formed around the junction plane between polycrystalline silicon film 4 and tungsten silicide film 5 to result in reduction in the electrostatic capacity measured via the gate electrode and the gate insulation film. In contrast, implantation of P prevents a depletion layer from being formed. Therefore, the electrostatic capacity measured via the gate electrode and the gate insulation film is not reduced.

By fabricating a semiconductor device according to the above steps, P is introduced into tungsten silicide film 5 similar to polycrystalline silicon film 4. A gate electrode is achieved of a structure in which P does not diffuse from polycrystalline silicon film 4 to tungsten silicide film 5 even when subjected to a subsequent thermal treatment. Even when an electric field is applied to the gate electrode formed of a double layered interconnection structure of polycrystalline silicon film 4 and tungsten silicide film 5, a depletion layer will not be formed at the contact face between polycrystalline silicon film 4 and tungsten silicide film 5. Thus, adverse affect on the transistor property can be suppressed even when a gate electrode is used of a double layered interconnection of polycrystalline silicon film 4/tungsten silicide film 5 according to the present fabrication method.

Since distribution of the impurity into tungsten silicide film 5 is carried out by ion implantation in the present embodiment, the impurity concentration can be adjusted easier at the tungsten silicide film 5 side in proximity to the interface between tungsten silicide film 5 and polycrystalline silicon film 4. It becomes easier to suppress the peel off between tungsten silicide film 5 and polycrystalline silicon film 4, and the diffusion of impurities from polycrystalline silicon film 4 to tungsten silicide film 5.

Although polycrystalline silicon film 4 is deposited with P implanted in advance in the present embodiment, the impurities can be distributed by ion implantation after polycrystalline silicon film 4 is formed. Although tungsten silicide film 5 is subjected to ion implantation after deposition by CVD, a similar effect can be obtained by depositing a tungsten silicide film 5 added with P in advance. P is employed as the impurity to be implanted into polycrystalline silicon film 4 and tungsten silicide film 5 in the present embodiment. Alternatively, As, B or $BF_2$ can be used. Also, a titanium silicide film or a cobalt silicide film can be used as refractory metal silicide film 5 instead of tungsten silicide film 5 employed in the present embodiment.

When a gate electrode including P type impurities and a gate electrode including N type impurities are to be formed on one semiconductor substrate, it is to be noted that polycrystalline silicon films 4 added in advance with different types of impurity cannot be deposited at the same time. However, by depositing polycrystalline silicon films 4 at respective positions simultaneously, and then selectively implanting ions of different conductivity types at respective positions, gate electrodes of a different conductivity types can be formed with a fewer number of steps.

The method of distributing the impurity by depositing a polycrystalline silicon film added in advance with impurities is advantageous over the method by ion implantation in that the number of fabrication steps can be reduced. It is to be noted that there is the possibility of ions passing through the polycrystalline silicon film or the tungsten silicide film if the polycrystalline silicon film is too thin in ion implantation. Therefore, impurity implantation through the method of depositing a polycrystalline silicon film added with impurities in advance is preferable than ion implantation. Furthermore, the former method is advantageous in that the concentration of the distributed impurities can be maintained constant over the entire thickness of the film.

Figure 5:
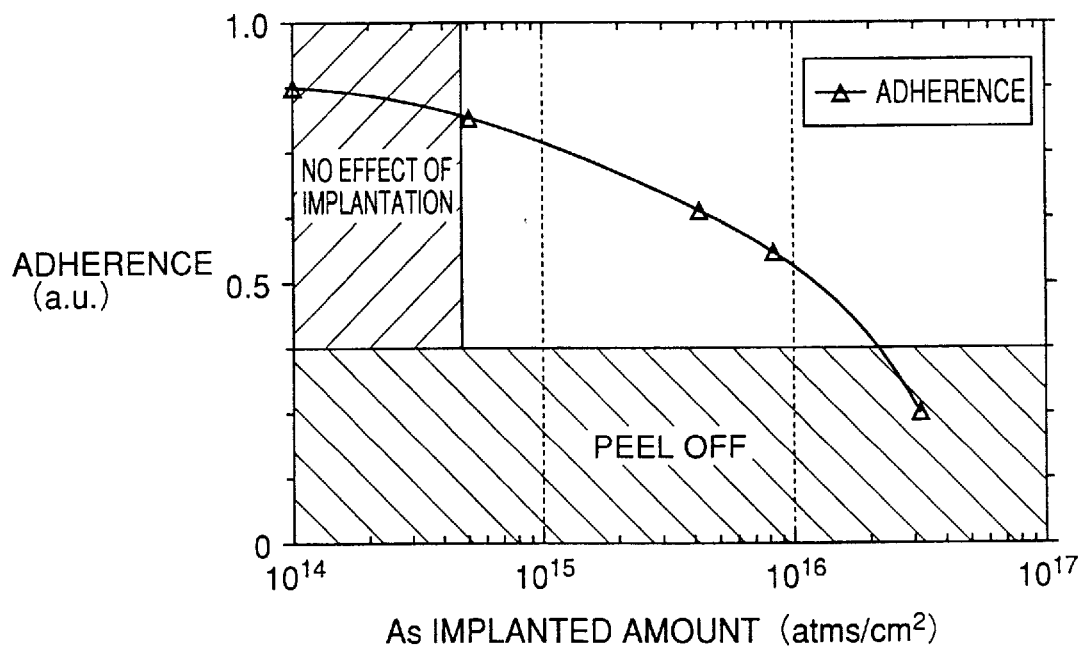
FIG. 5 shows the relationship between the amount of ion implantation into a tungsten silicide film and adherence in the semiconductor device of the first embodiment.

FIG. 5 is a graph with the adherence between tungsten silicide film 5 and interlayer oxide film 6 when impurities are implanted into tungsten silicide film 5 plotted along the ordinate and the amount of ion implantation towards tungsten silicide film 5 plotted along the abscissa. The adherence is represented as the ratio of the stress when peeling occurs under the state of impurities being implanted to 1, where 1 corresponds to the stress causing peeling between interlayer oxide film 6 and tungsten silicide film 5, i.e., when the stress of 3000 dyn/cm·cm$^2$ is exerted in the horizontal direction on the interlayer oxide film under the state of no impurities being implanted. FIG. 5 also shows the region where ion implantation provides no effect and the region where peeling is expected to occur at the interface between tungsten silicide film 5 and interlayer oxide film 6. It is appreciated from FIG. 5 that the ion implantation amount towards tungsten silicide film 5 is preferably carried out under the condition of $5\times10^{14}$/cm$^2$–$2\times10^{16}$/cm$^2$. If the amount of impurities implanted is lower than $5\times10^{14}$/cm$^2$, the effect of ion implantation is so low that impurities will be diffused from polycrystalline silicon film 4 to tungsten silicide film 5. If the amount of impurity implantation is greater than $2\times10^{16}$/cm$^2$, peeling will occur at the interface between tungsten silicide film 4 and interlayer oxide film 6. The reason why the region exhibiting the adherence of less than 0.4 is defined to be the region where peeling is expected to occur is that the stress of approximately 1200 dyn/cm·cm$^2$ generally occurs between interlayer oxide film 6 and tungsten silicide film 5 in the formation of interlayer oxide film 6.

Figure 6:
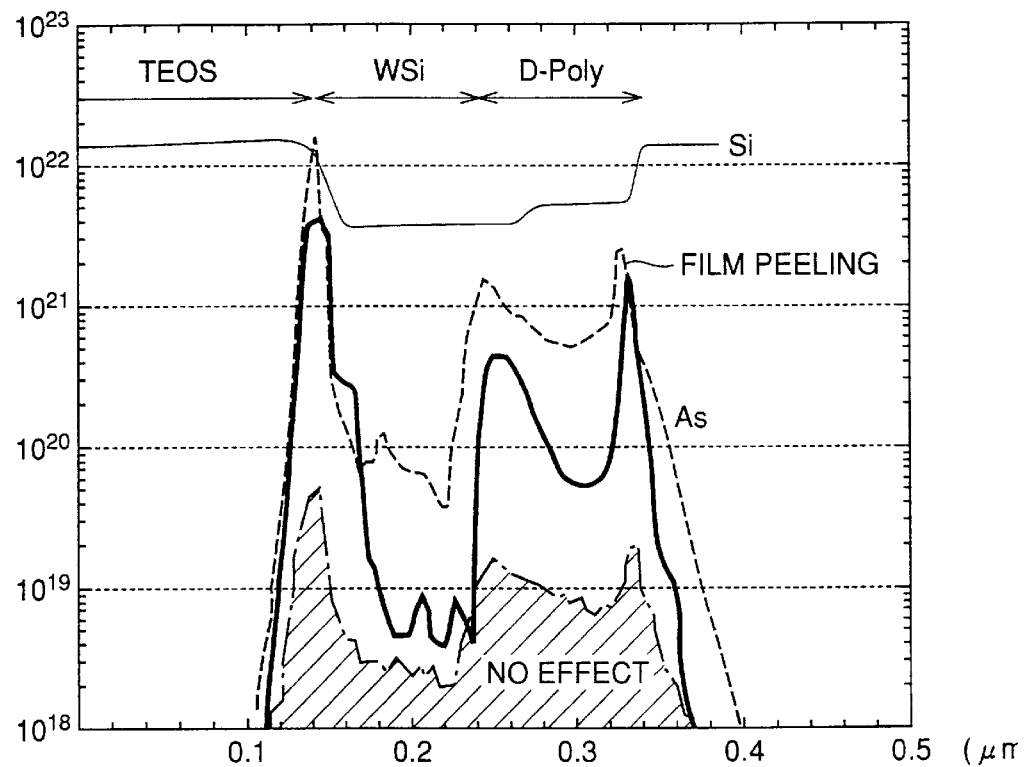
FIG. 6 shows the relationship between the depth and concentration of impurity As distributed from the interlayer oxide film to the semiconductor substrate of the semiconductor of the first embodiment.

FIG. 6 shows the relationship between the depth and concentration of the impurity of As implanted under the condition of 30 keV for the implantation energy and 4×10$^{15}$ cm$^2$ for the implantation amount. The bold line represents the As concentration distribution according to the present embodiment. The broken line represents the As concentration distribution when peeling occurs at the interface between the interlayer oxide film and the cobalt silicide film. The chain dotted line represents the As concentration distribution when a depletion layer is formed at the interface between the cobalt silicide film and the polycrystalline silicon film due to the low impurity implantation effect. The thin line represents the silicon concentration distribution.

It is appreciated from FIG. 6 that the average impurity concentration of distributing impurities into tungsten silicide film 5 is desirably 1×10$^{19}$ atms/cm$^3$–5×10$^{21}$ atms/cm$^3$. If the average impurity concentration is lower than 1×10$^{19}$ atms/cm$^3$, the ion implantation effect is so low that impurities will be diffused from polycrystalline silicon film 4 to tungsten silicide film 5. If the average impurity concentration is greater than 5×10$^{21}$ atms/cm$^3$, peeling will occur at the interface between tungsten silicide film 4 and interlayer oxide film 6 deposited on tungsten silicide film 5.

FIG. 6 also shows the impurity profile where the effect of preventing formation of a depletion layer between polycrystalline silicon film 4 and tungsten silicide film 5 by impurity implantation is absent and the impurity profile where peeling occurs at the interface between tungsten silicide film 4 and interlayer oxide film 5 by impurity implantation, represented by a chain dotted line and a broken, respectively. According to these impurity profiles, it is appreciated that the local impurity concentration in proximity to the interface between tungsten silicide film 5 (WSi) and interlayer oxide film 6 (TEOS) must be set to 5×10$^{19}$ atms/cm$^3$–2×10$^{22}$ atms/cm$^3$. If the local impurity concentration is greater than 5×10$^{19}$ atms/cm$^3$, the average impurity density is also increased. Therefore, impurities are diffused from polycrystalline silicon film 4 to tungsten silicide film 5 since there is no effect of impurity implantation at the interface between the TEOS and WSi, as seen from the impurity profile represented by the chain dotted line in FIG. 6. If the local impurity concentration is lower than 2×10$^{22}$ atms/cm$^3$, peeling occurs at the interface between tungsten silicide film 5 and interlayer oxide film 6 as appreciated from the peel off at the interface between the TEOS and WSi by the impurity profile shown by the broken line in FIG. 6.

Figure 7:
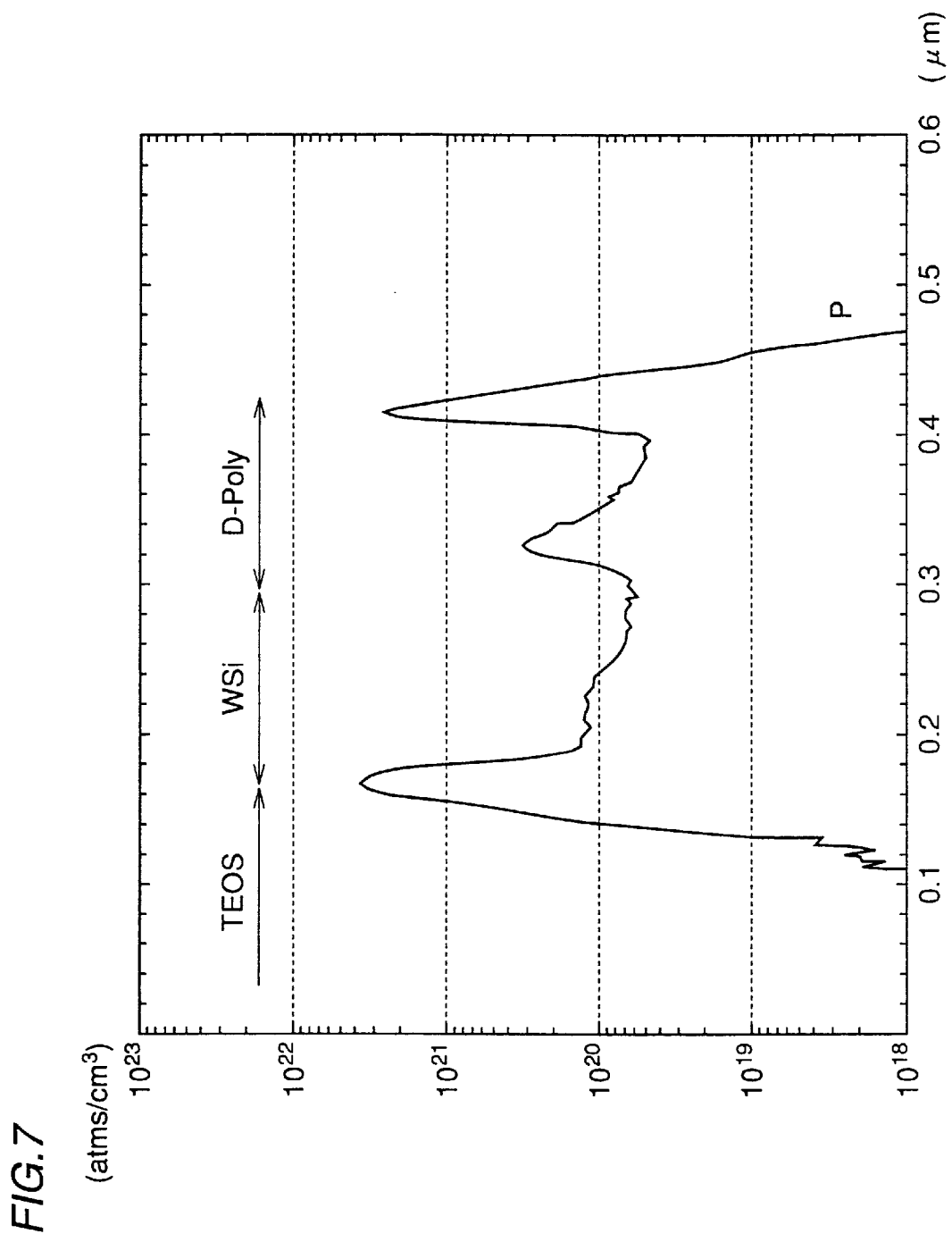
FIG. 7 shows the relationship between the depth and concentration of impurity P distributed from the interlayer oxide film to the semiconductor substrate of the semiconductor device of the first embodiment.

Although FIG. 6 shows the case where As is implanted as the impurity, a similar result can be obtained also from the P impurity profile shown in FIG. 7.

The ion implantation amount in implanting ions into the polycrystalline silicon film is preferably carried out under the condition of 1×10$^{15}$/cm$^2$–5×10$^{16}$/cm$^2$. If the amount of the impurity implanted is lower than 1×10$^{15}$/cm$^2$, the effect of ion implantation is low, resulting in degradation in the feature as a polycrystalline silicon conductive layer. If the implantation amount is greater than 5×10$^{16}$/cm$^2$, peeling will occur at the interface between polycrystalline silicon film 4 and tungsten silicide film 5 deposited on polycrystalline silicon film 4.

The average impurity concentration when impurities are distributed in the polycrystalline silicon is desirably 1×10$^{10}$ atms/cm$^3$–5×10$^{21}$ atms/cm$^3$. If the average impurity concentration is lower than 1×10$^{20}$ atms/cm$^3$, the ion implantation effect is so low that the feature as a conductive layer of polycrystalline silicon film 4 is reduced. If the average impurity concentration is greater than 5×10$^{21}$ atms/cm$^3$, peeling will occur at the interface between polycrystalline silicon film 4 and tungsten silicide film 5.

Second Embodiment

Figure 8:
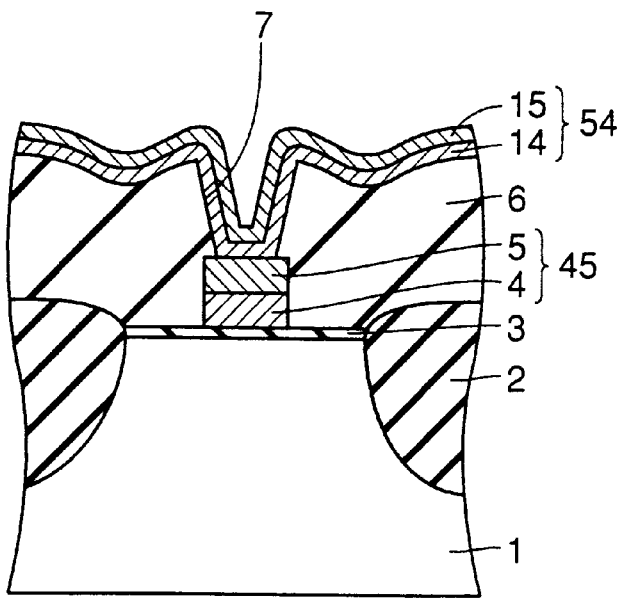
FIGS. 8 and 9 are sectional views of a semiconductor device according to a second embodiment of the present invention corresponding to respective steps of a fabrication method thereof.
Figure 9:
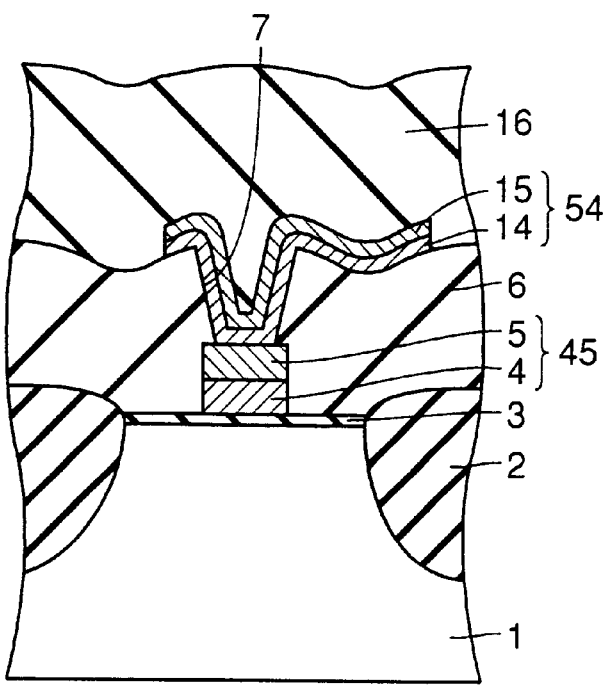

The method of fabricating a semiconductor device according to a second embodiment of the present invention will be described hereinafter with reference to FIGS. 8–10. Under the state where the gate electrode of the transistor is formed, the semiconductor device of the present embodiment has a silicon oxide film 6 of 5000 Å in thickness serving as an interlayer oxide film deposited by CVD to cover the entire surface of semiconductor substrate 1 as shown in FIG. 3. Using lithography and dry etching, a contact hole 7 arriving at tungsten silicide film 5 constituting the gate electrode is formed. Above silicon oxide film 6 including this contact hole 7, a polycrystalline silicon film 14 of 700 Å in thickness added with P in advance is formed using a tubular type reduced pressure CVD under the condition of 575° C. for the film growth temperature and 0.2 Torr for the deposition pressure with PH$_3$ as the dopant so that the impurity concentration becomes 6×10$^{20}$ atms/cm$^3$.

Then, using a single wafer reduced pressure CVD apparatus, a tungsten silicide film 15 of 700 Å in thickness added with P in advance is formed on polycrystalline silicon film 14 under the condition of 550° C. for the film growth temperature and 1.2 Torr for the deposition pressure with PH$_3$ as the dopant, so that the impurity concentration becomes 2×10$^{20}$ atms/cm$^3$. The state of the semiconductor device at this stage is shown in FIG. 8. By lithography and dry etching, a double layered interconnection structure 54 of polycrystalline silicon film 14/tungsten silicide film 15 is formed as shown in FIG. 9. Then, an interlayer oxide film 16 is formed so as to cover double layered interconnection structure 54. Through the step of applying thermal treatment on polycrystalline silicon film 14 and tungsten silicide film 15, the local impurity concentration of tungsten silicide film 15 in the proximity of the interface between interlayer oxide film 16 and tungsten silicide film 16 can be set to 5×10$^{19}$ atms/cm$^3$–2×10$^{22}$ atms/cm$^3$.

According to the semiconductor device fabricated as described above, the contact interconnection has a double layered interconnection structure 54 of polycrystalline silicon film 4/tungsten silicide film 5. The average impurity concentration of polycrystalline silicon film 4 is 6×10$^{20}$ atms/cm$^3$. The average impurity concentration of tungsten silicide film 5 is 2×10$^{20}$ atms/cm$^3$.

Figure 10:
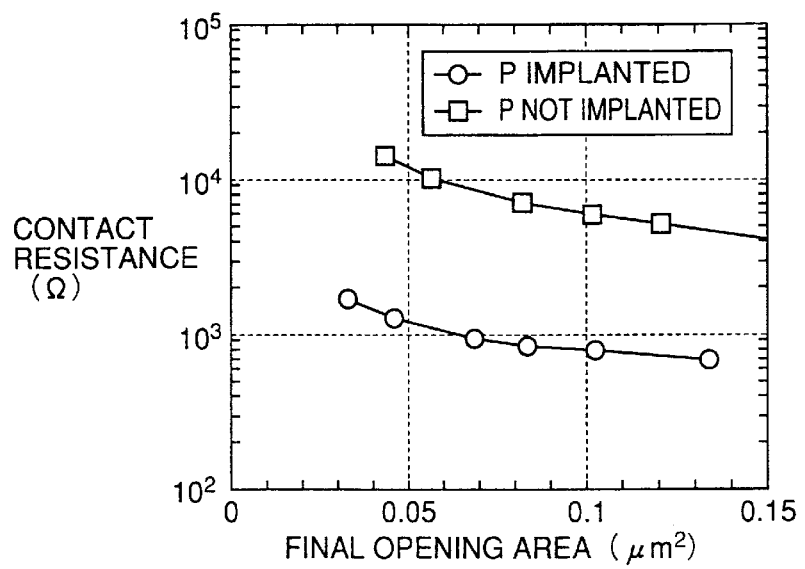
FIG. 10 is a graph showing the relationship between the contact resistance and the final opening area of the contact hole in the two-layered structure interconnection of the semiconductor device of the second embodiment.

The relationship between the final opening area and the contact resistance was evaluated for double layered interconnection structure 54 formed by the above steps, as shown in the graph of FIG. 10. It is appreciated from the results that the contact resistance is reduced for tungsten silicide film 15 doped with P than that not doped with P. The introduction of P prevents depletion at the junction plane between polycrystalline silicon 14 and tungsten silicide film 15. As a result, the contact resistance is reduced.

By fabricating a semiconductor device according to such steps, tungsten silicide film 15 is doped with P, similar to polycrystalline silicon film 14. A contact interconnection of a structure in which P is not diffused from polycrystalline silicon film 14 to tungsten silicide film 15 is achieved even when a subsequent thermal treatment is applied. Therefore, a depletion layer will not be formed in the proximity of the contact between polycrystalline silicon film 14 and tungsten silicide film 15 even when an electric field is applied to the interconnection of this double layered interconnection structure 54 after the contact interconnection layer is formed. Thus, increase of the contact resistance with gate electrode 45 can be suppressed even when contact is provided to gate electrode 45 by double layered structure interconnection 54 of polycrystalline silicon film 14/tungsten silicide film 15.

In the present embodiment, polycrystalline silicon film 14 is doped with P in advance and then deposited. A similar effect can be obtained even when P ions are implanted into polycrystalline silicon film 14 after formation of polycrystalline silicon film 14. Also, tungsten silicide film 15 doped with P in advance is deposited in the present embodiment. However, ions can be implanted into tungsten silicide film 15 after deposition of tungsten silicide film 15 by CVD. Although P is employed as the impurity to be added into polycrystalline silicon film 14 and tungsten silicide film 15 in the present embodiment, As, B or $BF_2$ can be used instead. Furthermore, a titanium silicide film or a cobalt silicide film can be used as a refractory metal silicon film instead of the tungsten silicide film used in the present embodiment.

When a contact interconnection including P type impurities and a contact interconnection including N type impurities are to be formed on one semiconductor substrate, it is to be noted that polycrystalline silicon films 14 added in advance with different types of impurities cannot be deposited at the same time. However, by depositing polycrystalline silicon films 14 at respective positions simultaneously, and then selectively implanting ions of different conductivity types to each polycrystalline silicon film, and by selectively implanting impurities into tungsten silicide film 5 in a similar manner, a contact interconnection of a different conductivity type can be formed with a fewer number of steps.

The method of distributing impurities into polycrystalline silicon film 14 and tungsten silicide film 15 by depositing a polycrystalline silicon film added in advance with impurities is advantageous over the method by ion implantation in that the number of fabrication steps can be reduced. It is to be noted that there is the possibility of ions passing through the polycrystalline silicon film and the tungsten silicide film if polycrystalline silicon film 14 and tungsten silicide film 15 are too thin in ion implantation. Therefore, impurity distribution through the method of depositing a polycrystalline silicon film added with impurities in advance is preferable than ion implantation. Furthermore, the former method is advantageous in that the concentration of the distributed impurities can be maintained constant in the direction of depth of polycrystalline silicon film 14 and tungsten silicide film 15.

From the standpoint of preventing peeling and the effect of impurity distribution as in the first embodiment, the conditions are desirably set as set forth in the following. The amount of ion to be implanted into tungsten silicide film 15 is $5\times10^{14}/cm^2-2\times10^{16}/cm^2$. The average distribution concentration of distributing impurities into tungsten silicide film 15 is to be $5\times10^{19}$ atms/$cm^3-2\times10^{21}$ atms/$cm^3$. The amount of ions to be implanted into polycrystalline silicon film 14 is $1\times10^{15}/cm^2-5\times10^{16}/cm^2$. The average impurity concentration when impurities are distributed into polycrystalline silicon film 14 is $1\times10^{20}$ atms/$cm^3-5\times10^{21}$ atms/$cm^3$.

Similar to the first embodiment, the local impurity concentration in the proximity of the interface with interlayer oxide film 16 when impurities are distributed into tungsten silicide film 14 is set to $5\times10^{19}$ atms/$cm^3-2\times10^{22}$ atms/$cm^3$. Since the local impurity concentration is greater than $5\times10^{19}$ atms/$cm^3$, diffusion of impurities from polycrystalline silicon film 14 to tungsten silicide film 15 can be prevented. Also, since the impurity concentration is lower than $2\times10^{22}$ atms/$cm^3$, the peel off at the interface between tungsten silicide film 15 and interlayer oxide film 16 deposited on tungsten silicide film 15 can be prevented.

Third Embodiment

Figure 11:
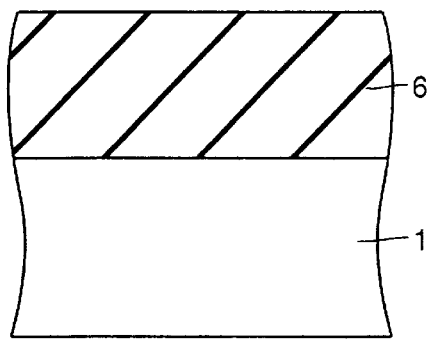
FIGS. 11, 12, and 13 are sectional views of a semiconductor device according to a third embodiment of the present invention corresponding to respective steps in a fabrication method thereof.

The method of fabricating a semiconductor device according to a third embodiment of the present invention will be described with reference to FIGS. 11–14. The semiconductor device of the present invention has a silicon oxide film of 500 Å in thickness deposited by CVD as an interlayer oxide film 6 so as to cover the entire surface of semiconductor substrate 1, as shown in FIG. 11. Then, a contact hole 7 arriving at semiconductor substrate 1 is formed in interlayer oxide film 6 by lithography and dry etching. On interlayer oxide film 6 including contact hole 7, a polycrystalline silicon 14 of 700 Å doped in advance with P is formed using a tubular reduced pressure CVD apparatus under the condition of 575° C. for the film growth temperature and 0.2 Torr for the deposition pressure with $PH_3$ as the dopant, so that the impurity concentration becomes $6\times10^{20}$ atms/$cm^3$.

Figure 12:
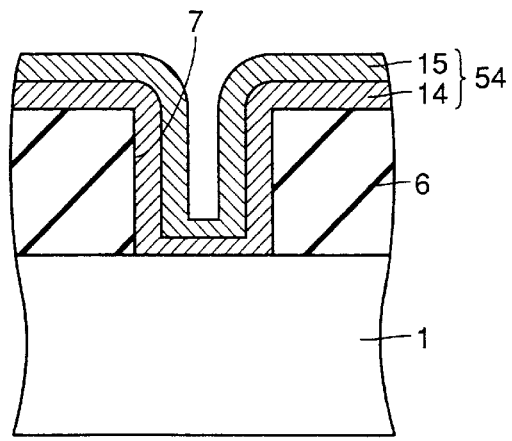
Figure 13:
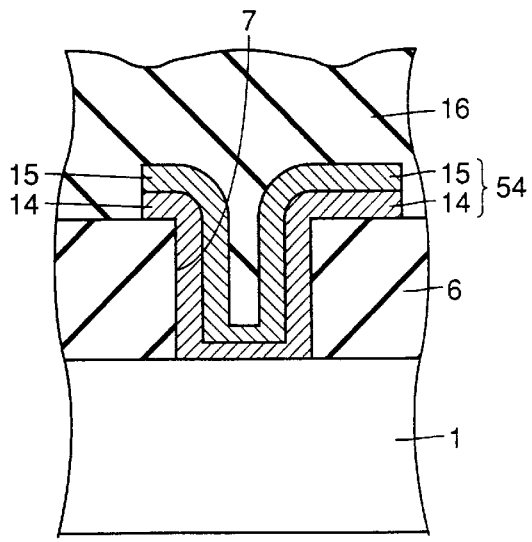

Referring to FIG. 12, using a single wafer type reduced pressure CVD apparatus, a tungsten silicide film 15 of 700 Å in film thickness doped with P in advance is formed on polycrystalline silicon 14 under the condition of 550° C. for the film growth temperature and 1.2 Torr for the deposition pressure with $PH_3$ as the dopant, so that the impurity concentration becomes $2\times10^{20}$ atms/$cm^3$. Referring to FIG. 13, a double layered structure 54 of polycrystalline silicon 14/tungsten silicide film 15 is formed by lithography and dry etching. Then, an interlayer oxide film 16 is formed to cover double layered interconnection structure 54. Then, polycrystalline silicon film 14 and tungsten silicide film 15 are subjected to thermal treatment, whereby the local impurity concentration of tungsten silicide film 15 in the proximity of the interface between interlayer oxide film 16 and tungsten silicide film 15 is set to $5\times10^{19}$ atms/$cm^3-2\times10^{22}$ atms/$cm^3$.

According to the semiconductor fabricated by the above method, the contact interconnection has a double layered interconnection structure 54 of polycrystalline silicon film 14/tungsten silicide film 15. The average impurity concentration of polycrystalline silicon film 14 is $6\times10^{20}$ atms/$cm^3$.

The average impurity concentration of tungsten silicide film 15 is $2\times10^{22}$ atms/$cm^3$.

Figure 14:
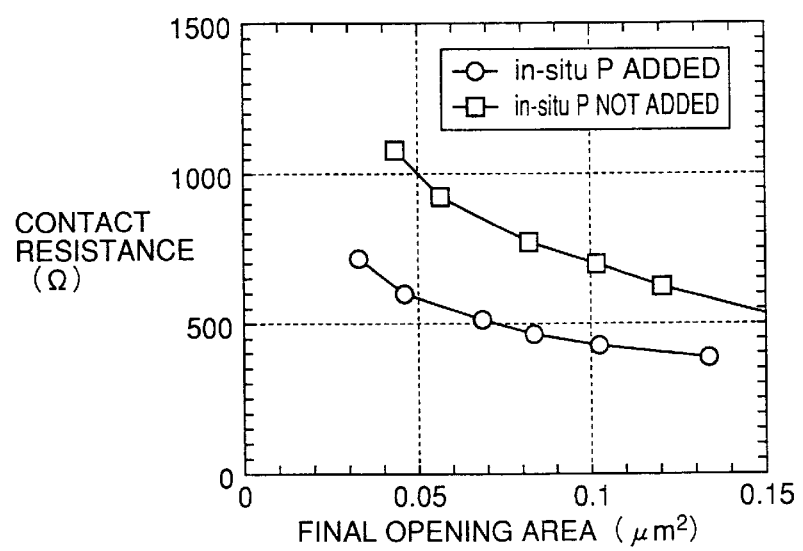
FIG. 14 is a graph showing the relationship between contact resistance and the final opening area of the contact hole according to the interconnection of the two-layered structure of the semiconductor device of the third embodiment.
Figure 15:
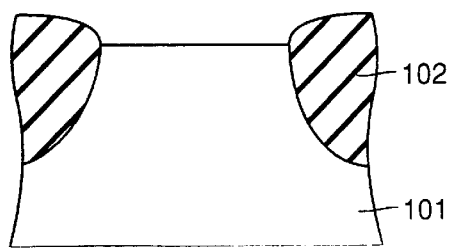
FIGS. 15, 16, and 17 are sectional views of a conventional semiconductor device corresponding to respective steps in a fabrication method thereof.
Figure 16:
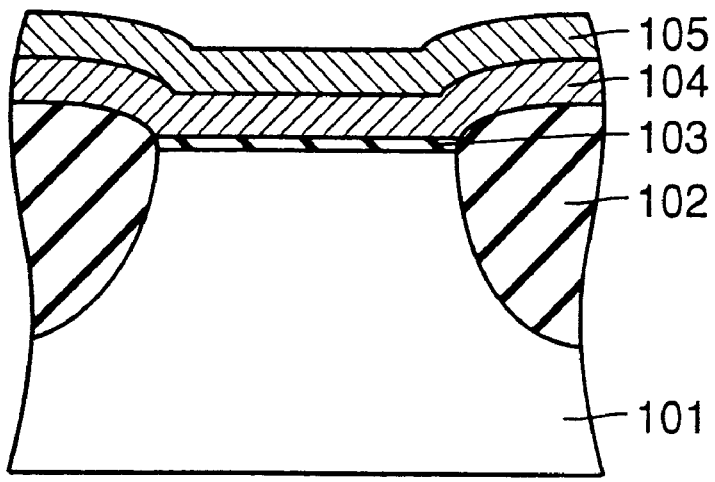
Figure 17:
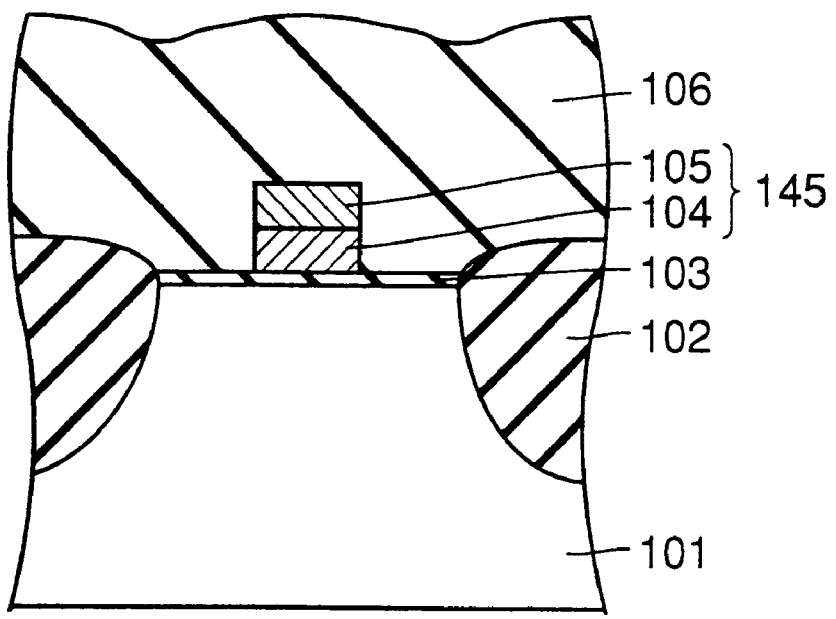

The relationship between the final opening area and contact resistance for double layered interconnection structure 54 formed by the above steps is evaluated, as shown in the graph of FIG. 14. It is appreciated that the contact resistance is reduced for tungsten silicide film 15 doped with P than that not doped with P. The addition of P provides the advantage that depletion at the junction plane between polycrystalline silicon film 14 and tungsten silicide film 15 is suppressed, whereby the contact resistance is reduced.

Similar to polycrystalline silicon film 4, by fabricating a semiconductor device according to the present embodiment, a contact interconnection is obtained of a structure in which P is not diffused from polycrystalline silicon film 14 to tungsten silicide film 15 even when thermal treatment is applied afterwards by virtue of tungsten silicide film 15 doped with P. Similar to the second embodiment, a depletion layer will not be formed at the contacting plane between polycrystalline silicon film 14 and tungsten silicide film 15 even when an electric field is applied to the contact interconnection layer of double layered interconnection structure 54. Therefore, increase in the contact resistance with semiconductor substrate 1 can be suppressed even for a double layered interconnection structure 54 of polycrystalline silicon film 14/tungsten silicide film 15.

The local impurity concentration in the proximity of the interface with interlayer oxide film 16 when impurities are diffused into tungsten silicide film 15 is $5\times10^{19}$ atms/$cm^3$–$2\times10^{22}$ atms/$cm^3$. Since the local impurity concentration is greater than $5\times10^{19}$ atms/$cm^3$, diffusion of impurities from polycrystalline silicon film 14 to tungsten silicide film 15 can be prevented. Also, since the local impurity concentration is lower than $2\times10^{22}$ atms/$cm^3$, peel off at the interface between tungsten silicide film 14 and interlayer oxide film 16 deposited on tungsten silicide film 15 can be prevented. Other advantages are similar to those of the contact interconnection described in the second embodiment.

Although a silicon oxide film is used as an insulation film in the above first to third embodiments, the advantage of preventing peel off at the interface between the refractory metal silicide film and the insulation film can be achieved when using an insulation film of another type such as a silicon nitride film. Furthermore, although a polycrystalline silicon film is employed as the underlying interconnection of the polycide interconnection in the above first to third embodiments, the advantage of preventing formation of a depletion layer can be achieved when the polycrystalline silicon film includes another material to some extent such as unamorphous silicon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a silicon-containing film formed on a semiconductor substrate, and having a first impurity;
   a refractory metal silicide film formed on said silicon-containing film, and having a second impurity of a conductivity type identical to the conductivity type of said first impurity and of the same or different composition; and
   an insulation film formed on said refractory metal silicide film,
   said second impurity having a concentration in proximity to an interface between said insulation film and said refractory metal silicide film set to a range of $5\times10^{19}$ atms/$cm^3$–$2\times10^{22}$ atms/$cm^3$, wherein the second impurity has a concentration distribution with a peak value at said interface between said insulation film and said refractory metal silicide film.

2. The semiconductor device according to claim 1, wherein said silicon-containing film includes a polycrystalline silicon film.

3. The semiconductor device according to claim 1, wherein said second impurity includes one or more materials selected from the group consisting of P, As, B and $BF_2$.

4. The semiconductor device according to claim 1, wherein said refractory metal silicide film includes one of a tungsten silicide film, a cobalt silicide film, and a titanium silicide film.

5. The semiconductor device according to claim 1, wherein said insulation film includes a silicon oxide film.

6. The semiconductor device according to claim 1, wherein said silicon-containing film and said refractory metal silicide film form a gate electrode of a field effect transistor.

7. The semiconductor device according to claim 1, wherein said silicon-containing film is directly connected to a surface of said semiconductor substrate.

8. The semiconductor device according to claim 1, wherein said silicon-containing film is directly connected to another conductive layer.

9. A semiconductor device comprising:
   a silicon-containing film formed on a semiconductor substrate, and having a first impurity;
   a refractory metal silicide film formed on said silicon-containing film, and having a second impurity of a conductivity type identical to the conductivity type of said first impurity and of the same or different composition; and
   an insulation film formed on said refractory metal silicide film,
   said second impurity having a concentration in proximity to an interface between said insulation film and said refractory metal silicide film set to a range of $5\times10^{19}$ atms/$cm^3$–$2\times10^{22}$ atms/$cm^3$, wherein said silicon-containing film is directly connected to a surface of said semiconductor substrate.

10. The semiconductor device according to claim 9, wherein said silicon-containing film includes a polycrystalline silicon film.

11. The semiconductor device according to claim 9, wherein said second impurity includes one or more materials selected from the group consisting of P, As, B and $BF_2$.

12. The semiconductor device according to claim 9, wherein said refractory metal silicide film includes one of a tungsten silicide film, a cobalt silicide film, and a titanium silicide film.

13. The semiconductor device according to claim 9, wherein said insulation film includes a silicon oxide film.

14. The semiconductor device according to claim 9, wherein said silicon-containing film is directly connected to another conductive layer.

* * * * *